(12) United States Patent
Wang

(10) Patent No.: US 11,935,612 B2
(45) Date of Patent: Mar. 19, 2024

(54) MEMORY USING DUAL SENSE AMPLIFIERS FOR ERROR DETECTION AND CORRECTION

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 156 days.

(21) Appl. No.: 17/663,704

(22) Filed: May 17, 2022

(65) Prior Publication Data

US 2022/0383975 A1 Dec. 1, 2022

(30) Foreign Application Priority Data

Jun. 1, 2021 (CN) .......................... 202110608218.5

(51) Int. Cl.
*G11C 29/50* (2006.01)
*G11C 7/06* (2006.01)
(Continued)

(52) U.S. Cl.
CPC .......... *G11C 29/50004* (2013.01); *G11C 7/06* (2013.01); *G11C 7/1069* (2013.01);
(Continued)

(58) Field of Classification Search
CPC ... G11C 29/50004; G11C 7/06; G11C 7/1069; G11C 11/4091; G11C 11/4094; G11C 11/4096; G11C 11/413; G11C 11/419; G11C 29/04; G11C 7/065; G11C 7/08; G11C 29/52; G11C 29/42; G11C 16/0483
See application file for complete search history.

(56) References Cited

U.S. PATENT DOCUMENTS

2008/0301526 A1* 12/2008 Kohler ................. G11C 7/1006
714/764
2010/0131825 A1* 5/2010 Kohler ................... G11C 29/52
714/763
(Continued)

FOREIGN PATENT DOCUMENTS

CN 1404065 A 3/2003
CN 113470711 A 10/2021
(Continued)

*Primary Examiner* — Donald H B Braswell
(74) *Attorney, Agent, or Firm* — Syncoda LLC; Feng Ma

(57) ABSTRACT

A memory includes a storage circuit, a first reading circuit, a second reading circuit, and a plurality of correcting circuits. The storage circuit includes a plurality of sense amplifier arrays and a plurality of storage unit arrays. The sense amplifier arrays and the storage unit arrays are arranged alternately, and the sense amplifier arrays are configured to perform data reading and writing on the storage unit arrays. The first reading circuit is configured to compare a reference voltage signal with a signal on a first data line corresponding to the first reading circuit, and output a comparison result as read-out data. The second reading circuit is configured to compare the reference voltage signal with a signal on a first data line corresponding to the second reading circuit, and output a comparison result as read-out data.

20 Claims, 11 Drawing Sheets

(51) Int. Cl.
  *G11C 7/10* (2006.01)
  *G11C 11/4091* (2006.01)
  *G11C 11/4094* (2006.01)
  *G11C 11/4096* (2006.01)
  *G11C 11/413* (2006.01)
  *G11C 11/419* (2006.01)
  *G11C 29/04* (2006.01)

(52) U.S. Cl.
  CPC ...... *G11C 11/4091* (2013.01); *G11C 11/4094* (2013.01); *G11C 11/4096* (2013.01); *G11C 11/413* (2013.01); *G11C 11/419* (2013.01); *G11C 29/04* (2013.01)

(56) References Cited

U.S. PATENT DOCUMENTS

| | | | |
|---|---|---|---|
| 2011/0185146 A1* | 7/2011 | Strauss | G06F 12/0215 713/400 |
| 2018/0144794 A1* | 5/2018 | Lee | G11C 13/004 |
| 2022/0093164 A1 | 3/2022 | Chi et al. | |
| 2022/0093201 A1 | 3/2022 | Shang et al. | |

FOREIGN PATENT DOCUMENTS

| | | |
|---|---|---|
| CN | 114203228 A | 3/2022 |
| CN | 114203230 A | 3/2022 |
| CN | 114203247 A | 3/2022 |
| WO | 2022057417 A1 | 3/2022 |
| WO | 2022057438 A1 | 3/2022 |
| WO | 2022057539 A1 | 3/2022 |

\* cited by examiner

US 11,935,612 B2

MEMORY USING DUAL SENSE AMPLIFIERS FOR ERROR DETECTION AND CORRECTION

CROSS-REFERENCE TO RELATED APPLICATION

This application claims priority to Chinese Patent Application No. 202110608218.5 filed on Jun. 1, 2021, the disclosure of which is hereby incorporated by reference in its entirety.

BACKGROUND

With the rapid development of semiconductor technologies, the market has higher and higher requirements for the storage capacity of semiconductor storage devices and the reading and writing efficiency of stored data. Moreover, with the improvement of user demand and cost requirements on an application side, it is required to continuously reduce the volume of a storage array unit of the semiconductor storage device, which brings higher challenges to fabrication processing, and causes a high probability that a single-storage unit failure defect and an adjacent-storage unit failure defect occur.

If the adjacent-storage unit failure defect in the semiconductor storage device can be found and fixed in time, the semiconductor storage device can be avoided from occurring the single-storage unit failure defect and the adjacent-storage unit failure defect during use under different application scenarios, thereby effectively improving the accuracy of stored data and the service life of a semiconductor storage product.

SUMMARY

The disclosure relates to the technical field of semiconductor storage, and in particular to a memory.

On this basis, a memory is provided, which can find and fix an adjacent-storage unit failure defect in a semiconductor storage device, thereby improve the accuracy of stored data and the service life of a semiconductor storage product.

In order to achieve the above objective and other objectives, the disclosure provides a memory. The memory includes a storage circuit, a first reading circuit, a second reading circuit, and a plurality of correcting circuits. The storage circuit includes a plurality of sense amplifier arrays and a plurality of storage unit arrays. The sense amplifier arrays and the storage unit arrays are arranged alternately, and the sense amplifier arrays are configured to perform data reading and writing on the storage unit arrays. The sense amplifier arrays include a first sense amplifier array and a second sense amplifier array that are adjacent to each other. The first reading circuit is electrically connected to the first sense amplifier array through a first data line, and is configured to compare a reference voltage signal with a signal on the first data line corresponding to the first reading circuit, and output a comparison result as read-out data. The second reading circuit is electrically connected to the second sense amplifier array through the first data line, and is configured to compare the reference voltage signal with a signal on the first data line corresponding to the first reading circuit, and output a comparison result as read-out data. The plurality of correcting circuits are configured to perform error detection/error correction on the read-out data. The first reading circuit and the second reading circuit are configured to respectively transmit the read-out data outputted therefrom to different correcting circuits.

In the memory in the above embodiments, the storage unit arrays and the sense amplifier arrays configured to perform data reading and writing on the storage unit arrays are arranged alternately in the storage circuit. The sense amplifier arrays include a first sense amplifier array and a second sense amplifier array that are adjacent to each other. A first reading circuit is arranged to be electrically connected to the first sense amplifier array through a first data line, and to be configured to compare a reference voltage signal with a signal on the first data line corresponding to the first reading circuit, and output a comparison result as read-out data. A second reading circuit is arranged to be electrically connected to the second sense amplifier array through the first data line, and to be configured to compare the reference voltage signal with the signal on the first data line corresponding to the first reading circuit, and output a comparison result as read-out data. The first reading circuit and the second reading circuit respectively transmit the read-out data outputted therefrom to different correcting circuits. For example, the first reading circuit is arranged to transmit the read-out data outputted therefrom to a first correcting circuit, and the second reading circuit is arranged to transmit the read-out data outputted therefrom to a second correcting circuit. The correcting circuits respectively perform error detection/error correction on the respectively received read-out data, for example, data to be written and check code data. Therefore, it is guaranteed that the adjacent-storage unit failure defect can be detected, and a 2-bit data error caused by the adjacent-storage unit failure defect in the semiconductor storage device can be found and fixed in time, thereby improving the accuracy of stored data and the service life of a semiconductor storage product.

In one of the embodiments, the first reading circuit includes a plurality of first reading circuit units. Each of the first reading circuit units is electrically connected to the first sense amplifier array through a first data line corresponding to the first reading circuit. The first reading circuit unit includes a first input circuit, a first reference circuit, a first amplification circuit, and a first output circuit. The first input circuit is electrically connected to the first data line, and is configured to receive a signal on the first data line. The first reference circuit is configured to receive a reference voltage signal. The first amplification circuit is electrically connected to each of the first input circuit and the first reference circuit, and is configured to compare the reference voltage signal and the signal on the first data line corresponding to the first reading circuit, and amplify the comparison result. The first output circuit is electrically connected to the first amplification circuit, and is configured to output an amplified comparison result. The data read by the first reading circuit unit is amplified by the first reading circuit unit, so as to improve the anti-noise capacity of transmitted data. The first amplification circuit is arranged to compare the received reference voltage signal with the signal on the first data line to output the amplified comparison result, to improve the sensitivity of the first amplification circuit to signal sensing.

In one of the embodiments, the first amplification circuit includes a first transistor, a second transistor, a third transistor, and a fourth transistor. The first transistor is configured to enable a source to be electrically connected to a first voltage. The second transistor is configured to enable a source to be electrically connected to a first voltage node, and a drain to be electrically connected to a drain of the first transistor. The third transistor is configured to enable a source to be electrically connected to the first voltage, a drain to be electrically connected to a gate of the first transistor, and a gate to be electrically connected to the drain of the first transistor. The fourth transistor is configured to enable a source to be electrically connected to a second voltage node, a drain to be electrically connected to each of the drain of the third transistor and the gate of the second transistor, and a gate to be electrically connected to the drain of the first transistor.

In the memory in the above embodiments, the first transistor and the second transistor are arranged in series to form a first inverter, and the third transistor and the fourth transistor are arranged in series to form a second inverter. Therefore, the first inverter and the second inverter operate together to form a latch. The latch can amplify and latch the data read through the first data line and output the data, so as to improve the anti-noise capacity of the outputted data.

In one of the embodiments, the first reading circuit unit further includes a first pre-charging circuit. The first pre-charging circuit is electrically connected to each of the drain of the first transistor and the drain of the third transistor, and is configured to pre-charge.

In one of the embodiments, the first input circuit includes a fifth transistor. The fifth transistor is configured to enable a source to be electrically connected to the second voltage, a drain to be electrically connected to the first voltage node, and a gate to be electrically connected to the first data line.

In one of the embodiments, the first reference circuit includes a sixth transistor, a seventh transistor, and an eighth transistor. The sixth transistor is configured to enable a source to be electrically connected to a third voltage node, a drain to be electrically connected to the second voltage node, and a gate to be electrically connected to a reference voltage. The seventh transistor is configured to enable a source to be electrically connected to the second voltage, a drain to be electrically connected to the third voltage node, and a gate to be electrically connected to each of the gate of the sixth transistor and the reference voltage. The eighth transistor is configured to enable a source to be electrically connected to the second voltage, a drain to be electrically connected to the third voltage node, and a gate to be electrically connected to the reference voltage signal.

In one of the embodiments, the first output circuit further includes a first sub-output circuit and a second sub-output circuit. The first sub-output circuit is electrically connected to all of the second voltage node, a second data line, and a second complementary data line, and is configured to output an amplified comparison result. The second sub-output circuit is electrically connected to all of the first voltage node, the second data line, and the second complementary data line, and is configured to output the amplified comparison result and match an output load of the first amplification circuit. The second data line and the second complementary data line transmit mutually-inverted data. The accuracy of data transmission can be improved by referencing or comparing the data on the second data line and the data on the second complementary data line with each other.

In one of the embodiments, the first output circuit further includes a first switch circuit and a second switch circuit. The first voltage node is electrically connected to an equalization signal through the first switch circuit. The second voltage node is electrically connected to the equalization signal through the second switch circuit.

In one of the embodiments, the first switch circuit includes a ninth transistor. The second switch circuit includes a tenth transistor. The ninth transistor is configured to enable: a source to be electrically connected to the first voltage, a drain to be electrically connected to the first voltage node, and a gate to be electrically connected to the equalization signal. The tenth transistor is configured to enable a source to be electrically connected to the first voltage, a drain to be electrically connected to the second voltage node, and a gate to be electrically connected to the equalization signal.

In one of the embodiments, the first sub-output circuit includes an eleventh transistor, a twelfth transistor, a thirteenth transistor, and a fourteenth transistor. The eleventh transistor is configured to enable a source to be electrically connected to the first voltage, and a gate to be electrically connected to the second voltage node. The twelfth transistor is configured to enable a drain to be electrically connected to the drain of the eleventh transistor, and a gate to be electrically connected to each of the second voltage node and the gate of the eleventh transistor. The thirteenth transistor is configured to enable a source to be grounded, a drain to be electrically connected to the source of the twelfth transistor, and a gate to be electrically connected to the second data line. The fourteenth transistor is configured to enable a source to be electrically connected to the first voltage, a drain to be electrically connected to each of the second complementary data line and the drain of the eleventh transistor, and a gate to be electrically connected to the second data line.

In one of the embodiments, the second sub-output circuit includes a fifteenth transistor, a sixteenth transistor, a seventeenth transistor, an eighteenth transistor, a nineteenth transistor, and a twentieth transistor. The fifteenth transistor is configured to enable a source to be electrically connected to the first voltage, a drain to be electrically connected to the second data line, and a gate to be electrically connected to the first voltage node. The sixteenth transistor is configured to enable a drain to be electrically connected to the drain of the fifteenth transistor, and a gate to be electrically connected to each of the first voltage node and the gate of the fifteenth transistor. The seventeenth transistor is configured to enable a drain to be electrically connected to the source of the sixteenth transistor, and a gate to be electrically connected to the second complementary data line. The eighteenth transistor is configured to enable a source to be grounded, a drain to be electrically connected to the source of the seventeenth transistor, and a gate to be electrically connected to a reset signal. The nineteenth transistor is configured to enable a source to be electrically connected to the first voltage, a drain to be electrically connected to the second data line, and a gate to be electrically connected to each of the second complementary data line and the gate of the seventeenth transistor. The twentieth transistor is configured to enable a source to be electrically connected to the first voltage, a drain to be electrically connected to the second data line, and a gate to be electrically connected to each of the reset signal and the gate of the eighteenth transistor.

In one of the embodiments, the first reading circuit unit further includes an regulating circuit. The regulating circuit is electrically connected to each of the first data line, a reading selection signal, the first amplification circuit, and the first input circuit, and is configured to regulate the driving capacity of the first input circuit.

In one of the embodiments, the regulating circuit includes a twenty-first transistor and a twenty-second transistor. The twenty-first transistor is configured to enable a source to be electrically connected to the second voltage, a drain to be electrically connected to the first voltage node, and a gate to be electrically connected to the reading selection signal. The twenty-second transistor is configured to enable a source to be electrically connected to the second voltage, a drain to be electrically connected to the first voltage node, and a gate to be electrically connected to the first data line through a third switch circuit.

In one of the embodiments, the first reading circuit unit further includes a first writing circuit unit. The first writing circuit unit is electrically connected to the second data line, a write enable signal, an equalization signal, and the first data line. The first writing circuit unit is configured to write data into the first data line according to the write enable signal and the equalization signal.

In one of the embodiments, the first writing circuit unit includes a twenty-third transistor, a twenty-fourth transistor, a first NOR gate, a second NOR gate, a first NAND gate, a first AND gate, and a first inverter. The twenty-third transistor is configured to enable a source to be electrically connected to the first voltage, and a drain to be electrically connected to the first data line. The twenty-fourth transistor is configured to enable a source to be grounded, and a drain to be electrically connected to each of the drain of the twenty-third transistor and the first data line. The first NOR gate is configured to enable an output end to be electrically connected to a gate of the twenty-third transistor. The second NOR gate is configured to enable an output end to be electrically connected to a gate of the twenty-fourth transistor. The first NAND gate is configured to enable an output end to be electrically connected to a first input end of the second NOR gate, a first input end to be electrically connected to the write enable signal, and a second input end to be electrically connected to the equalization signal. The first AND gate is configured to enable an output end to be electrically connected to a second input end of the first NOR gate, a first input end to be electrically connected to the write enable signal, and a second input end to be electrically connected to a second input end of the second NOR gate and the second data line. The first inverter is configured to enable an output end to be electrically connected to the first input end of the first NOR gate, and an input end to be electrically connected to the equalization signal.

BRIEF DESCRIPTION OF THE DRAWINGS

In order to illustrate the embodiments of the present disclosure or the technical solutions in the conventional art more clearly, the drawings used in the description of the embodiments or the conventional art will be briefly described below. It is apparent that the drawings in the following description are only some embodiments of the present disclosure, and other drawings can be obtained from those skilled in the art according to these drawings without any creative work.

REFERENCE SIGNS IN THE DRAWINGS

100, storage circuit;
101, single-storage unit failure defect;
102, adjacent-storage unit failure defect;
10, sense amplifier array;
11, first sense amplifier array;
12, second sense amplifier array;
20, storage unit array;
30, first data line;
41, first reading circuit;
42, second reading circuit;
51, first correcting circuit;
52, second correcting circuit;
411, first amplification circuit;
412, first input circuit;
413, first reference circuit;
414, first output circuit;
4141, first sub-output circuit;
4142, second sub-output circuit;
4143, first switch circuit;
4144, second switch circuit;
415, first pre-charging circuit;
416, regulating circuit; and
417, first writing circuit unit.

DETAILED DESCRIPTION

In order to facilitate the understanding of the present disclosure, the present disclosure will be described in more detail below with reference to related accompanying drawings. Preferred embodiments of the present disclosure are shown in the accompanying drawings. However, the present disclosure may be implemented in many different forms and are not limited to the embodiments described herein. On the contrary, an objective of providing these embodiments is to make the disclosed content of the present disclosure more thorough and comprehensive.

Unless otherwise defined, all technical and scientific terms used herein shall have the same meanings as commonly understood by those skilled in the art to which the present disclosure belongs. The terms used herein in the specification of the present disclosure are only used to describe specific embodiments, but are not intended to limit the present disclosure. In addition, some terms used throughout the description and the following claims refer to specific elements. Those skilled in the art will understand that manufacturers can indicate components by different names. The present disclosure does not intend to distinguish components with different names but the same functions.

In the following description and embodiments, the terms "including" and "comprising" are used in an open manner, and thus should be interpreted to mean "including, but not limited to . . . ". Similarly, the term "connection" is intended to express indirect or direct electrical connection. Correspondingly, if one device is connected to another device, the connection can be completed by direct electrical connection or by indirect electrical connection of other devices and connectors.

It is to be understood that, although the terms "first", "second", etc. may be used for describing various elements in the disclosure, such element should not be limited to these terms. These terms are used only to distinguish one element from another. For example, without departing from the scope of the disclosure, a first element may also be referred to as a second element, and similarly, the second element may also be referred to as the first element.

Figure 1:
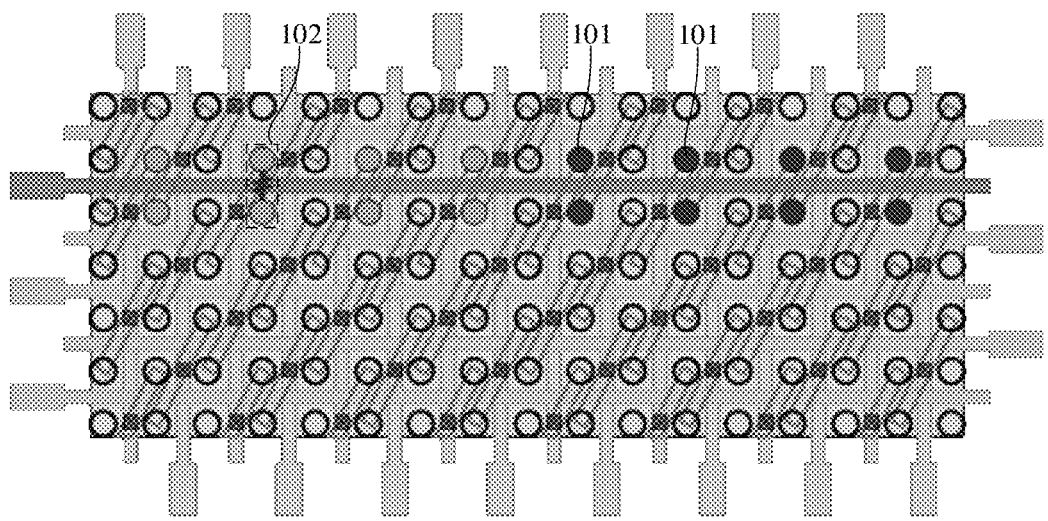
FIG. 1 is a schematic structural diagram of a memory in which a storage unit failure defect occurs.

For a semiconductor storage device, the storage capacity and the accuracy of stored data are one of the important performance parameters. However, with the increase of the storage capacity of the semiconductor storage device, the number of storage units distributed in a chip per unit area is increasing, the density of the storage units in a storage chip is increasing, and a spacing distance between adjacent storage units is decreasing, which results in that the semiconductor storage device is prone to a single-storage unit failure defect 101 and an adjacent-storage unit failure defect 102 in different application scenarios, referring to FIG. 1. However, the conventional method for checking read data of a semiconductor chip storage unit cannot detect the adjacent-storage unit failure defect 102, and cannot find and fix a 2-bit data error caused by the adjacent-storage unit failure defect 102 in the semiconductor storage device in time, which affects the accuracy of storage data of a semiconductor storage product. In order to find and fix the 2-bit data error caused by the adjacent-storage unit failure defect 102 in the semiconductor storage device in time, improve the accuracy of the stored data and the service life of the semiconductor storage product, the disclosure provides a memory.

Figure 2:
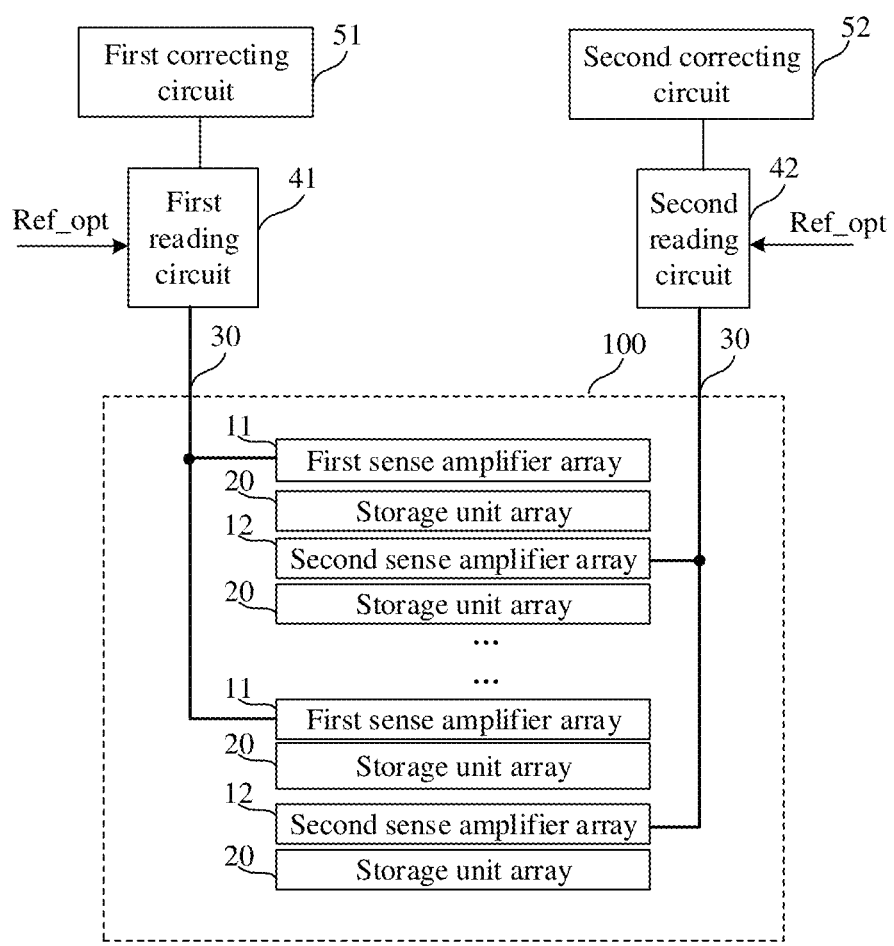
FIG. 2 is a schematic diagram of a circuit principle of a memory provided by an embodiment of the disclosure.

As an example, referring to FIG. 2, a memory is provided in an embodiment of the disclosure. The memory includes a storage circuit 100, a first reading circuit 41, a second reading circuit 42, and a plurality of correcting circuits. The storage circuit 100 includes a plurality of sense amplifier arrays 10 and a plurality of storage unit arrays 20. The sense amplifier arrays 10 and the storage unit arrays 20 are arranged alternately, and the sense amplifier arrays 10 include a first sense amplifier array 11 and a second sense amplifier array 12 that are adjacent to each other. The sense amplifier arrays 10 are configured to perform data reading and writing on the storage unit arrays 20. The first reading circuit 41 is electrically connected to the first sense amplifier array 11 through a first data line 30, and is configured to compare a reference voltage signal Ref_opt with a signal on the first data line 30 corresponding to the first reading circuit, and output a comparison result as read-out data. The second reading circuit 42 is electrically connected to the second sense amplifier array 12 through a first data line 30, and is configured to compare the reference voltage signal Ref_opt with the signal on the first data line 30 corresponding to the second reading circuit, and output a comparison result as read-out data. The second sense amplifier array 12 is adjacent to the first sense amplifier array 11. The plurality of correcting circuits are configured to perform error detection/error correction on the read-out data. The first reading circuit 41 and the second reading circuit 42 are configured to respectively transmit the read-out data outputted therefrom to different correcting circuits.

As an example, continuing referring to FIG. 2, the storage unit arrays 20 and the sense amplifier arrays 10 configured to perform data reading and writing on the storage unit arrays 20 are arranged alternately in the storage circuit 100. The sense amplifier arrays 10 include a first sense amplifier array 11 and a second sense amplifier array 12 that are adjacent to each other. The first reading circuit 41 is arranged to be electrically connected to the first sense amplifier array 11 through a first data line 30, such as a global data line YIO, and is configured to compare a reference voltage signal Ref_opt with a signal on the first data line 30 corresponding to the first reading circuit, and output a comparison result as read-out data. The second reading circuit 42 is arranged to be electrically connected to the second sense amplifier array 12 through a first data line 30, such as a global data line YIO, and is configured to compare the reference voltage signal Ref_opt with a signal on the first data line 30 corresponding to the second reading circuit, and output a comparison result as read-out data. The first reading circuit 41 transmits the read-out data outputted therefrom to a first correcting circuit 51, and the second reading circuit 42 transmits the read-out data outputted therefrom to a second correcting circuit 52. The first correcting circuit 51 and the second correcting circuit 52 are different correcting circuits. Therefore, the correcting circuits respectively perform error detection/error correction on the respectively received read-out data which, for example, include data to be written and check code data, it is guaranteed that the adjacent-storage unit failure defect can be detected. Therefore, the 2-bit data error caused by the adjacent-storage unit failure defect in the semiconductor storage device can be found and fixed in time, the accuracy of the stored data and the service life of a semiconductor storage product can be improved.

Figure 3:
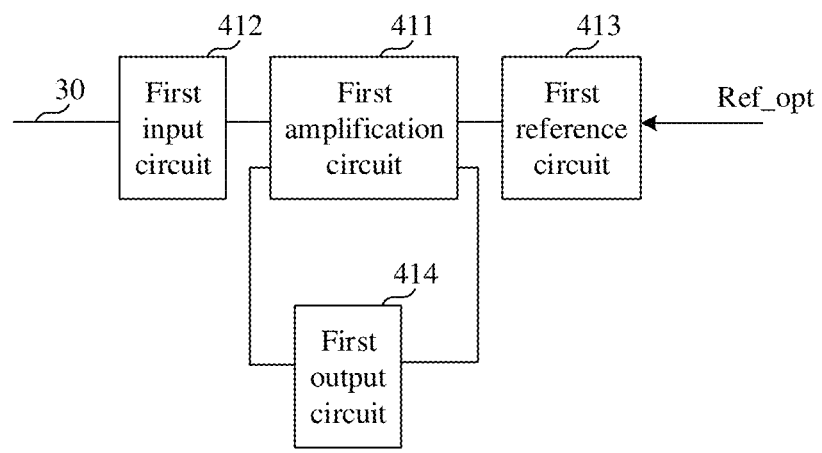
FIG. 3 is a schematic diagram of a circuit principle of a first reading circuit unit in a first embodiment of the disclosure.

As an example, referring to FIG. 3, in an embodiment of the disclosure, the first reading circuit 41 includes a plurality of first reading circuit units. Each of the first reading circuit units is electrically connected to the first sense amplifier array 11 through the first data line 30. The first reading circuit unit may include a first input circuit 412, a first reference circuit 413, a first amplification circuit 411, and a first output circuit 414. The first input circuit 412 is electrically connected to the first data line 30, and is configured to receive the signal on the first data line 30. The signal on the first data line 30 received by the first input circuit 412 may include the data to be written and the check code data. The first reference circuit 413 is configured to receive a reference voltage signal Ref_opt. The first amplification circuit 411 is electrically connected to each of the first input circuit 412 and the first reference circuit 413, and is configured to compare the reference voltage signal Ref_opt with a signal on the first data line 30, and amplify a comparison result. The first output circuit 414 is electrically connected to the first amplification circuit 411, and is configured to output an amplified comparison result. The data read by the first reading circuit unit is amplified by the first reading circuit unit, so to improve the anti-noise capacity of transmitted data. The first amplification circuit 411 is arranged to compare the received reference voltage signal Ref_opt with the signal on the first data line 30 to output the amplified comparison result, which can improve the sensitivity of the first amplification circuit 411 for signal sensing.

Figure 4:
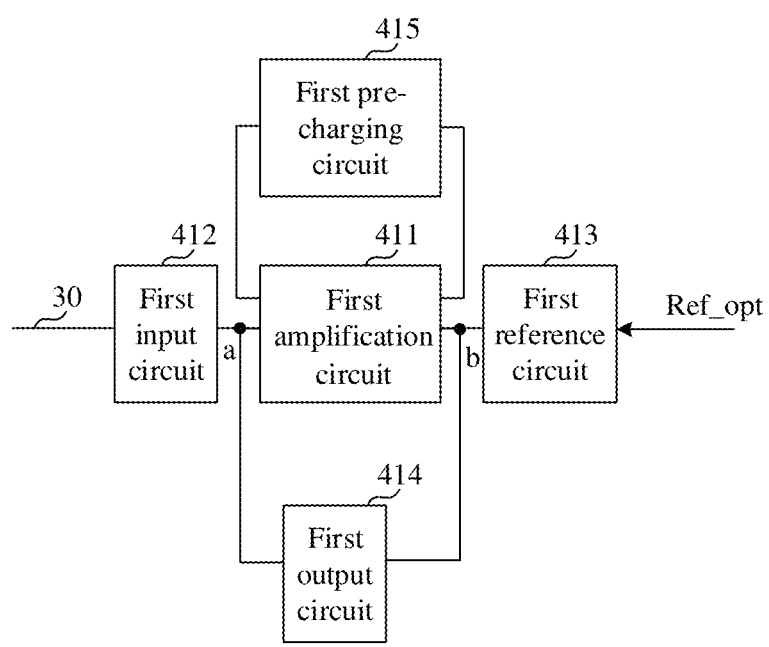
FIG. 4 is a schematic diagram of a circuit principle of a first reading circuit unit in a second embodiment of the disclosure.

As an example, referring to FIG. 4, in an embodiment of the disclosure, the first reading circuit unit further includes a first pre-charging circuit 415. The first pre-charging circuit 415 is electrically connected to the first amplification circuit 411, and is configured to pre-charge.

Figure 5:
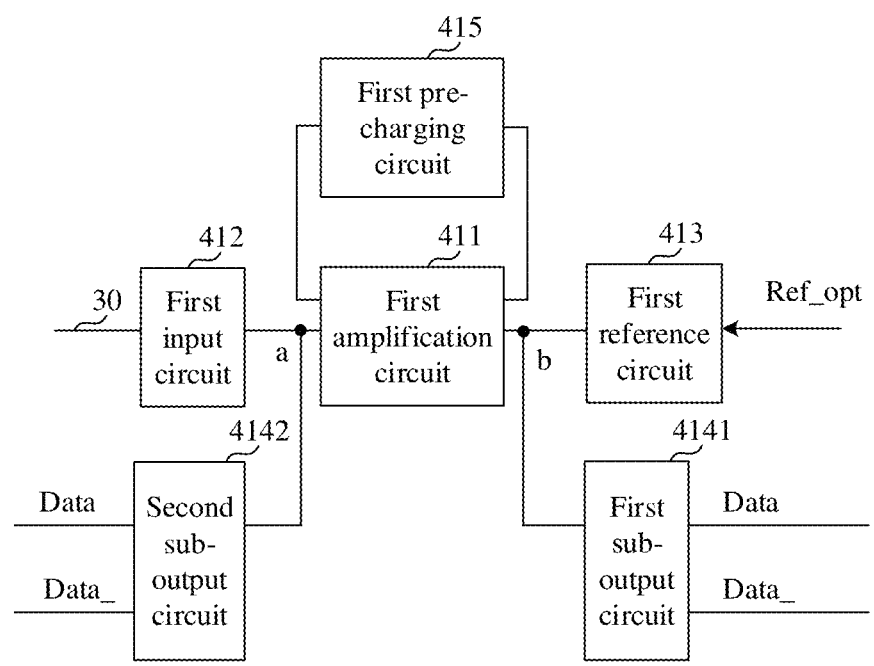
FIG. 5 is a schematic diagram of a circuit principle of a first reading circuit unit in a third embodiment of the disclosure.
Figure 6:
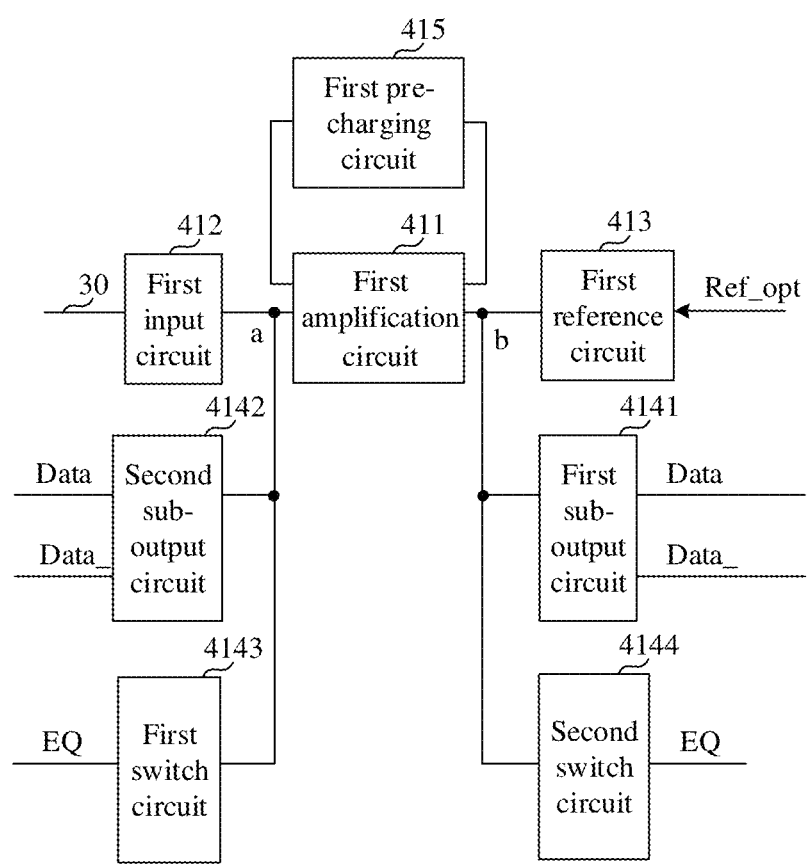
FIG. 6 is a schematic diagram of a circuit principle of a first reading circuit unit in a fourth embodiment of the disclosure.

As an example, referring to FIG. 5, in an embodiment of the disclosure, the first output circuit 414 further includes a first sub-output circuit 4141 and a second sub-output circuit

4142. The first sub-output circuit 4141 is electrically connected to each of a second voltage node b, a second data line Data, and a second complementary data line Data_, and is configured to output an amplified comparison result. The second sub-output circuit 4142 is electrically connected to each of a first voltage node a, the second data line Data, and the second complementary data line Data_, and is configured to output the amplified comparison result and match an output load of the first amplification circuit 411. The second data line Data and the second complementary data line Data_ transmit mutually-inverted data. The accuracy of data transmission can be improved by referencing or comparing the data on the second data line Data and the data on the second complementary data line Data_ with each other.

Figure 7:
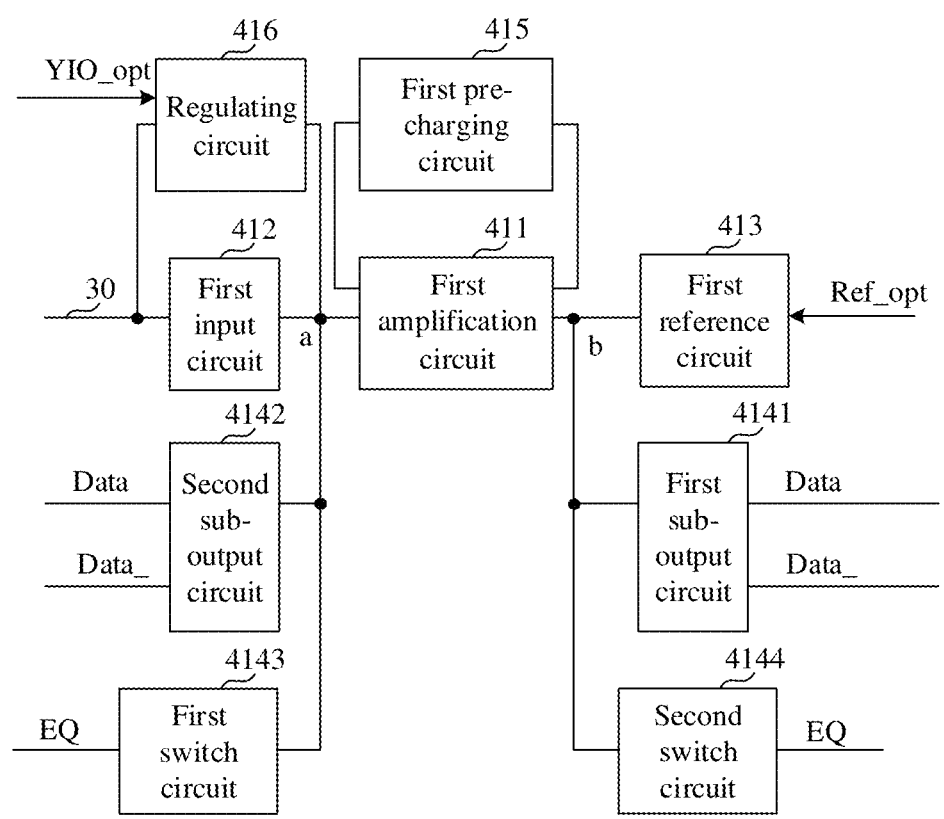
FIG. 7 is a schematic diagram of a circuit principle of a first reading circuit unit in a fifth embodiment of the disclosure.

As an example, referring to FIG. 7, in an embodiment of the disclosure, the first output circuit 414 includes a first switch circuit 4143 and a second switch circuit 4144. The first voltage node a is electrically connected to an equalization signal EQ through the first switch circuit 4143. The second voltage node b is electrically connected to an equalization signal EQ through the second switch circuit 4144.

As an example, referring to FIG. 7, in an embodiment of the disclosure, the first reading circuit further includes a regulating circuit 416. The regulating circuit 416 is electrically connected to each of the first data line 30, a reading selection signal YIO_opt, the first amplification circuit 411 and the first input circuit 412. The regulating circuit 416 is configured to regulate the driving capacity of the first input circuit 412.

Figure 8:
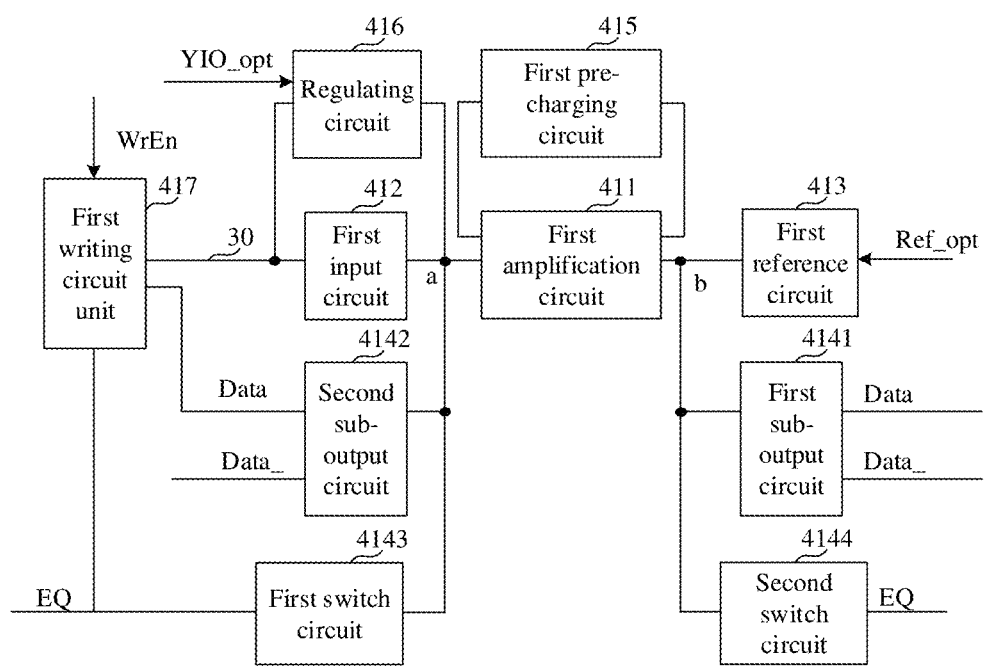
FIG. 8 is a schematic diagram of a circuit principle of a first reading circuit unit in a sixth embodiment of the disclosure.

As an example, referring to FIG. 8, in an embodiment of the disclosure, the first reading unit further includes a first writing circuit unit 417. The first writing circuit unit 417 is electrically connected to the second data line Data, a write enable signal WrEn, the equalization signal EQ and the first data line 30. The first writing circuit unit 417 is configured to write data into the first data line 30 according to the write enable signal WrEn and the equalization signal EQ.

Figure 9A:
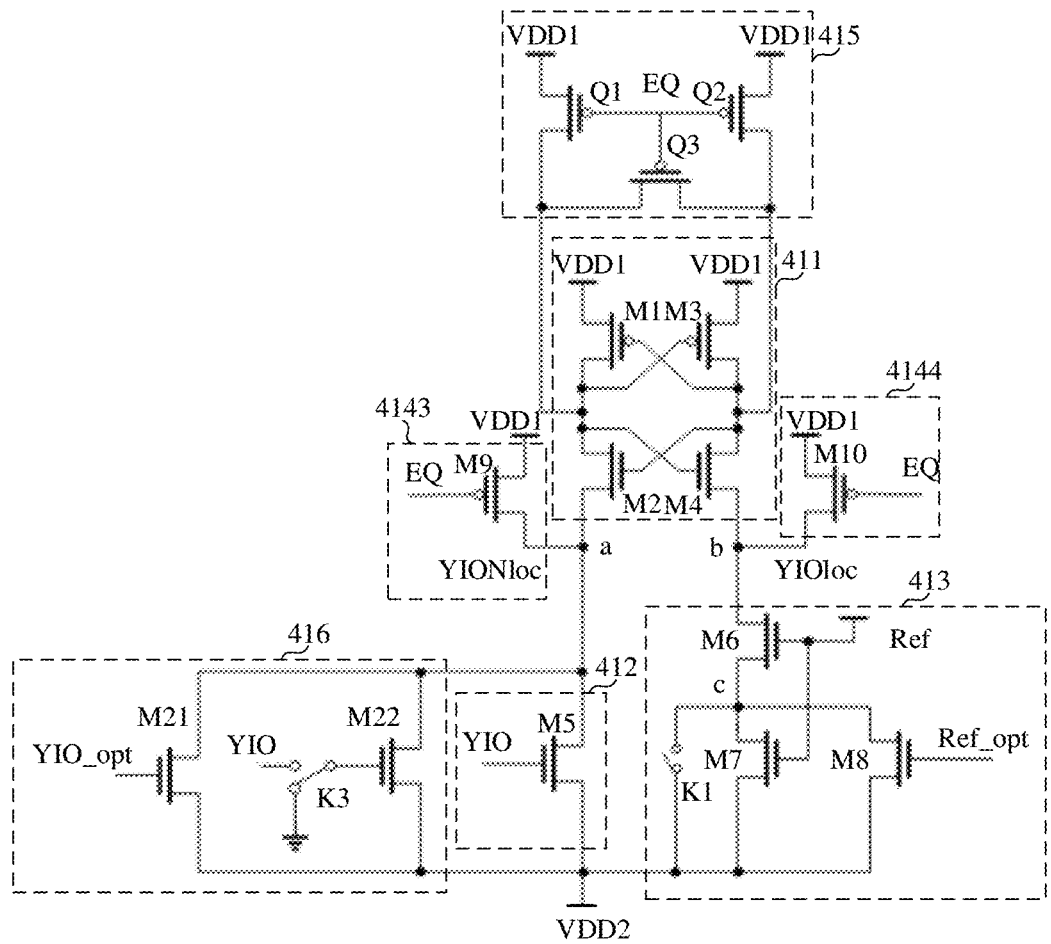
FIG. 9A is a schematic diagram of a circuit of a first reading circuit unit in an embodiment of the disclosure.

As an example, referring to FIG. 9A, in an embodiment of the disclosure, the first amplification circuit 411 includes a first transistor M1, a second transistor M2, a third transistor M3, and a fourth transistor M4. The first transistor M1 is configured to enable a source to be electrically connected to a first voltage VDD1. The second transistor M2 is configured to enable a source to be electrically connected to the first voltage node a, and a drain to be electrically connected to a drain of the first transistor M1. The third transistor M3 is configured to enable a source to be electrically connected to the first voltage VDD1, a drain to be electrically connected to a gate of the first transistor M1, and a gate to be electrically connected to the drain of the first transistor M1. The fourth transistor M4 is configured to enable a source to be electrically connected to a second voltage node b, a drain to be electrically connected to each of the drain of the third transistor M3 and the gate of the second transistor M2, and a gate to be electrically connected to the drain of the first transistor M1.

As an example, continuing referring to FIG. 9A, the first transistor M1 and the second transistor M2 are arranged in series to form a first inverter, the third transistor M3 and the fourth transistor M4 are arranged in series to form a second inverter, so that the first inverter and the second inverter operate together to form a latch. The latch can amplify and latch data acquired through the first input circuit 412 and output the data, so as to improve the anti-noise capacity of the outputted data. In an embodiment, the first reading circuit 41 further includes a first pre-charging circuit 415. The first pre-charging circuit 415 is electrically connected to each of the drain of the first transistor M1 and the drain of the third transistor M3, and is configured to pre-charge.

As an example, continuing referring to FIG. 9A, in an embodiment of the disclosure, the first pre-charging circuit 415 includes a transistor Q1, a transistor Q2, and a transistor Q3. The transistor Q1 is configured to enable a source to be electrically connected to the first voltage VDD1, a drain to be electrically connected to a drain of the first transistor M1, and a gate to be electrically connected to the equalization signal EQ. The transistor Q2 is configured to enable a source to be electrically connected to the first voltage VDD1, a drain to be electrically connected to a drain of the third transistor M3, and a gate to be electrically connected to the equalization signal EQ. The transistor Q3 is configured to enable a source to be electrically connected to the drain of the third transistor M3, a drain to be electrically connected to a drain of the first transistor M1, and a gate to be electrically connected to the equalization signal EQ.

As an example, continuing to refer to FIG. 9A, in an embodiment of the disclosure, the first input circuit 412 includes a fifth transistor M5. The fifth transistor M5 is configured to enable a source to be electrically connected to the second voltage VDD2, a drain to be electrically connected to the first voltage node a, and a gate to be electrically connected to a global data line YIO. In the embodiment, the amplitude of the second voltage VDD2 is lower than that of the first voltage VDD1. For example, the source of the fifth transistor M5 can be set to be grounded.

As an example, continuing referring to FIG. 9A, in an embodiment of the disclosure, the first reference circuit 413 includes a sixth transistor M6, a seventh transistor M7, and an eighth transistor M8. The sixth transistor M6 is configured to enable a source to be electrically connected to a third voltage node c, a drain to be electrically connected to the second voltage node b, and a gate to be electrically connected to a reference voltage. The seventh transistor M7 is configured to enable a source to be electrically connected to the second voltage node VDD2, a drain to be electrically connected to the third voltage node c, and a gate to be electrically connected to each of the gate of the sixth transistor M6 and the reference voltage Ref. The eighth transistor M8 is configured to enable a source to be electrically connected to the second voltage VDD2, a drain to be electrically connected to the third voltage node c, and a gate to be electrically connected to the reference voltage signal Ref_opt. In the embodiment, a drain of the seventh transistor M7 may be arranged to be electrically connected to the second voltage VDD2 through a switch K1. In the embodiment, the amplitude of the second voltage VDD2 is lower than that of the first voltage VDD1. For example, each of the source of the eighth transistor M7 and the source of the eighth transistor M8 may be arranged to be grounded.

As an example, continuing referring to FIG. 9A, in an embodiment of the present disclosure, the first switch circuit 4143 includes a ninth transistor M9. The second switch circuit 4144 includes a tenth transistor M10. The ninth transistor M9 is configured to enable a source to be electrically connected to the first voltage VDD1, a drain to be electrically connected to the first voltage node a, and a gate to be electrically connected to the equalization signal EQ. The tenth transistor M10 is configured to enable a source to be electrically connected to the first voltage VDD1, a drain to be electrically connected to the second voltage node b, and a gate to be electrically connected to the equalization signal.

As an example, continuing referring to FIG. 9A, in an embodiment of the present disclosure, the regulating circuit 416 includes a twenty-first transistor M21 and a twenty-second transistor M22. The twenty-first transistor M21 is configured to enable a source to be electrically connected to the second voltage VDD2, a drain to be electrically connected to the first voltage node a, and a gate to be electrically connected to a reading selection signal. The twenty-second transistor M22 is configured to enable a source to be electrically connected to the second voltage VDD2, a drain to be electrically connected to the first voltage node a, and a gate to be electrically connected to the global data line YIO through a third switch circuit K3. In the embodiment, the amplitude of the second voltage VDD2 is lower than that of the first voltage VDD1. For example, each of the source of the twenty-first transistor M21 and the source of the twenty-second transistor M22 may be arranged to be grounded.

Figure 9B:
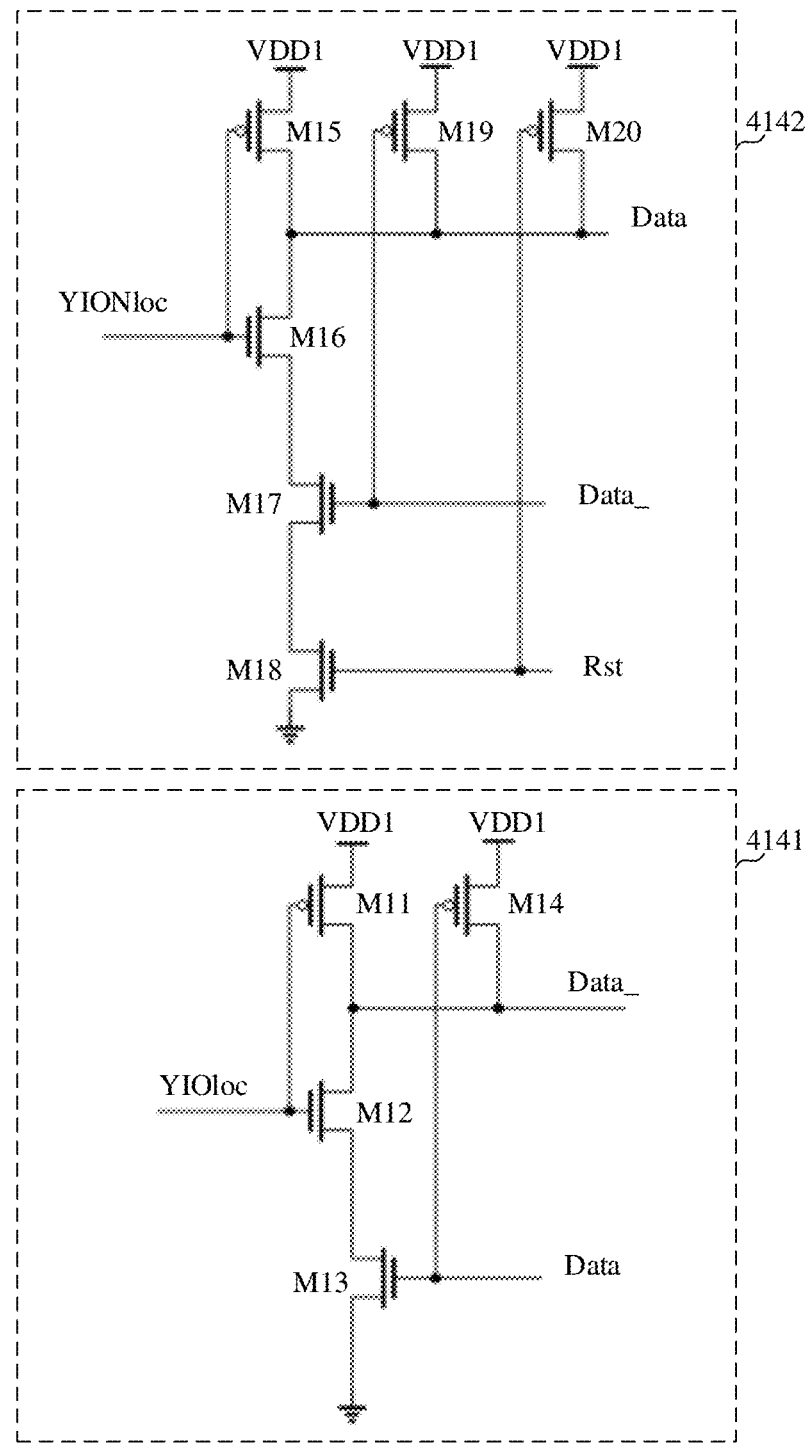
FIG. 9B is a schematic diagram of a circuit of a first output circuit in an embodiment of the disclosure.

As an example, referring to FIG. 9B, in an embodiment of the present disclosure, the first sub-output circuit 4141 includes an eleventh transistor M11, a twelfth transistor M12, a thirteenth transistor M13, and a fourteenth transistor M14. The eleventh transistor M11 is configured to enable a source to be electrically connected to the first voltage VDD1, and a gate to be electrically connected to the second voltage node b. The twelfth transistor M12 is configured to enable a drain to be electrically connected to the drain of the eleventh transistor M11, and a gate to be electrically connected to each of the second voltage node b and the gate of the eleventh transistor M11. The thirteenth transistor M13 is configured to enable a source to be grounded, a drain to be electrically connected to the source of the twelfth transistor M12, and a gate to be electrically connected to the second data line Data. The fourteenth transistor M14 is configured to enable source to be electrically connected to the first voltage VDD1, a drain to be electrically connected to each of the second complementary data line Data_ and the drain of the eleventh transistor M11, and a gate to be electrically connected to the second data line Data. In the embodiment, the second data line Data may be set as a local data line LIO, and the second complementary data line Data_ may be set as a complementary local data line LIO. The local data line LIO and the complementary local data line LIO transmit mutually-inverted data.

As an example, continuing referring to FIG. 9B, in an embodiment of the disclosure, the second sub-output circuit 4142 includes a fifteenth transistor M15, a sixteenth transistor M16, a seventeenth transistor M17, an eighteenth transistor M18, a nineteenth transistor M19, and a twentieth transistor M10. The fifteenth transistor M15 is configured to enable a source to be electrically connected to the first voltage VDD1, a drain to be electrically connected to the second data line Data, and a gate to be electrically connected to the first voltage node a. The sixteenth transistor M16 is configured to enable a drain to be electrically connected to the drain of the fifteenth transistor M15, and a gate to be electrically connected to each of the first voltage node a and the gate of the fifteenth transistor M15. The seventeenth transistor M17 is configured to enable a drain to be electrically connected to the source of the sixteenth transistor M16, and a gate to be electrically connected to the second complementary data line. The eighteenth transistor M18 is configured to enable a source to be grounded, a drain to be electrically connected to the source of the seventeenth transistor M17, and a gate to be electrically connected to a reset signal Rst. The nineteenth transistor is configured to enable a source to be electrically connected to the first voltage VDD1, a drain to be electrically connected to the second data line Data, and a gate to be electrically connected to each of the second complementary data line and the gate of the seventeenth transistor M17. The twentieth transistor is configured to enable a source to be electrically connected to the first voltage VDD1, a drain to be electrically connected to the second data line Data, and a gate to be electrically connected to each of the reset signal Rst and the gate of the eighteenth transistor M18. In the embodiment, the second data line Data may be set as a local data line LIO. In other embodiments of the disclosure, the second data line Data may be set as a local data line LIO.

Figure 10:
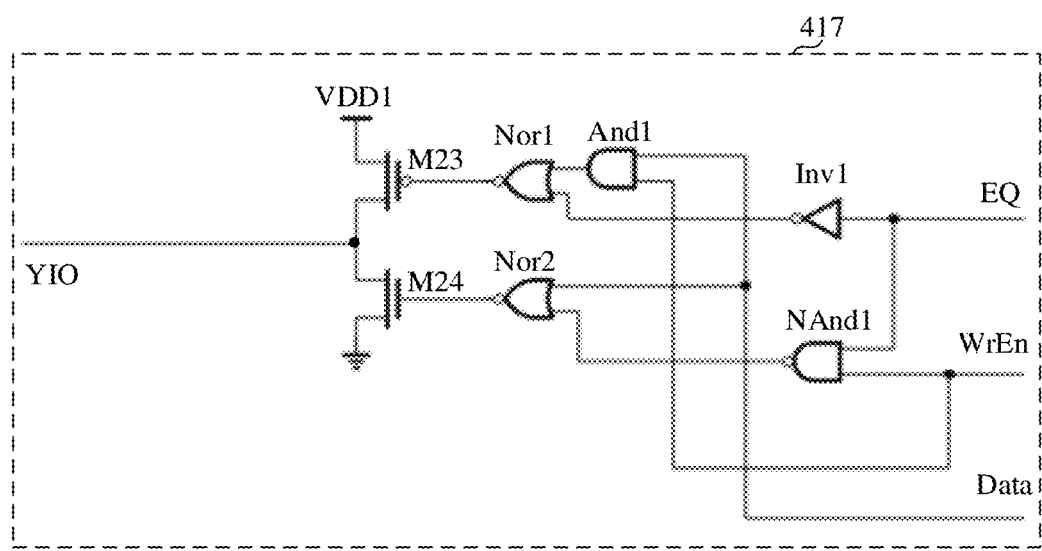
FIG. 10 is a schematic diagram of a circuit of a first writing circuit unit in an embodiment of the disclosure.

As an example, referring to FIG. 10, in an embodiment of the disclosure, the first writing circuit unit includes a twenty-third transistor M23, a twenty-fourth transistor M24, a first NOR gate Nor1, a second NOR gate Nor2, a first NAND gate NAnd1, a first AND gate And1, and a first inverter Inv1. The twenty-third transistor M23 is configured to enable a source to be electrically connected to the first voltage VDD1, and a drain to be electrically connected to the first data line 30. The twenty-fourth transistor M24 is configured to enable a source to be grounded, and a drain to be electrically connected to each of the drain of the twenty-third transistor M23 and the first data line 30. The first NOR gate Nor1 is configured to enable: an output end to be electrically connected to a gate of the twenty-third transistor M23. The second NOR gate Nor2 is configured to enable an output end to be electrically connected to a gate of the twenty-fourth transistor M24. The first NAND gate NAnd1 is configured to enable an output end to be electrically connected to a first input end of the second NOR gate Nor2, and a first input end to be electrically connected to the write enable signal, and a second input end to be electrically connected to the equalization signal. The first AND gate And1 is configured to enable an output end to be electrically connected to a second input end of the first NOR gate Nor1, a first input end to be electrically connected to the write enable signal, and a second input end to be electrically connected to each of a second input end of the second NOR gate Nor2 and the second data line Data. The first inverter Inv1 is configured to enable an output end to be electrically connected to the first input end of the first NOR gate Nor1, and an input end to be electrically connected to the equalization signal.

An implementation principle of the second reading circuit 42 in the disclosure is similar to that of the first reading circuit 41 in the above embodiment. Therefore, a specific implementation mode of the second reading circuit 42 is not described repeatedly anymore.

Please note that the above embodiments are for illustrative purposes only and are not intended to limit the disclosure.

Various embodiments in the present specification are described in a progressive manner, each embodiment focuses on differences from other embodiments, and regarding the identical or similar parts between the various embodiments, reference can be made to each other.

Various technical features of the above-described embodiments can be arbitrarily combined. For the sake of brevity of description, all possible combinations of the technical features in the above embodiments are not described. However, as long as there is no contradiction between the combinations of these technical features, all the combinations should be considered as the scope of this description.

The above embodiments are merely illustrative of several implementation manners of the present disclosure with specific and detailed description, and are not to be construed as limiting the patent scope of the present disclosure. It is to be noted that a number of variations and modifications may be made by those of ordinary skill in the art without departing from the conception of the present disclosure, and all the variations and modifications fall within the scope of protection of the present disclosure. Therefore, the scope of protection of the patent of the disclosure should be determined by the appended claims.

What is claimed is:

1. A memory, comprising:
a storage circuit comprising a plurality of sense amplifier arrays and a plurality of storage unit arrays, the sense amplifier arrays and the storage unit arrays being arranged alternately, and the sense amplifier arrays being configured to perform data reading and writing on the storage unit arrays, wherein the sense amplifier arrays comprise a first sense amplifier array and a second sense amplifier array that are adjacent to each other;
a first reading circuit which is electrically connected to the first sense amplifier array through a first data line, and is configured to compare a reference voltage signal with a signal on the first data line corresponding to the first reading circuit, and output a comparison result as read-out data;
a second reading circuit which is electrically connected to the second sense amplifier array through a first data line, and is configured to compare a reference voltage signal with a signal on the first data line corresponding to the second reading circuit, and output a comparison result as read-out data; and
a plurality of correcting circuits configured to perform at least one of error detection and error correction on the read-out data, wherein the first reading circuit and the second reading circuit are configured to respectively transmit the read-out data outputted therefrom to different correcting circuits.

2. The memory of claim 1, wherein the first reading circuit comprises a plurality of first reading circuit units, each of the first reading circuit units is electrically connected to the first sense amplifier array through the first data line corresponding to the first reading circuit; the first reading circuit unit comprises:
a first input circuit which is electrically connected to the first data line, and is configured to receive the signal on the first data line;
a first reference circuit configured to receive the reference voltage signal;
a first amplification circuit which is electrically connected to each of the first input circuit and the first reference circuit, and is configured to compare the reference voltage signal with the signal on the first data line corresponding to the first reading circuit, and amplify a comparison result; and
a first output circuit which is electrically connected to the first amplification circuit, and is configured to output an amplified comparison result.

3. The memory of claim 2, wherein the first amplification circuit comprises:
a first transistor configured to enable a source to be electrically connected to a first voltage;
a second transistor configured to enable a source to be electrically connected to a first voltage node, and a drain to be electrically connected to a drain of the first transistor;
a third transistor configured to enable a source to be electrically connected to the first voltage, a drain to be electrically connected to a gate of the first transistor, and a gate to be electrically connected to the drain of the first transistor; and
a fourth transistor configured to enable a source to be electrically connected to a second voltage node, a drain to be electrically connected to each of the drain of the third transistor and the gate of the second transistor, and a gate to be electrically connected to the drain of the first transistor.

4. The memory of claim 3, wherein the first reading circuit unit further comprises a first pre-charging circuit; the first pre-charging circuit is electrically connected to each of the drain of the first transistor and the drain of the third transistor, and is configured to pre-charge.

5. The memory of claim 3, wherein the first input circuit comprises:
a fifth transistor configured to enable a source to be electrically connected to a second voltage, a drain to be electrically connected to the first voltage node, and a gate to be electrically connected to the first data line.

6. The memory of claim 5, wherein the first reference circuit comprises:
a sixth transistor configured to enable a source to be electrically connected to a third voltage node, a drain to be electrically connected to the second voltage node, and a gate to be electrically connected to a reference voltage;
a seventh transistor configured to enable a source to be electrically connected to the second voltage, a drain to be electrically connected to the third voltage node, and a gate to be electrically connected to each of the gate of the sixth transistor and the reference voltage; and
an eighth transistor configured to enable a source to be electrically connected to the second voltage, a drain to be electrically connected to the third voltage node, and a gate to be electrically connected to the reference voltage signal.

7. The memory of claim 3, wherein the first input output circuit further comprises:
a first sub-output circuit which is electrically connected to each of the second voltage node, a second data line, and a second complementary data line, and is configured to output an amplified comparison result; and
a second sub-output circuit which is electrically connected to each of the first voltage node, the second data line, and the second complementary data line, and is configured to output the amplified comparison result and match an output load of the first amplification circuit, wherein the second data line and the second complementary data line transmit mutually-inverted data.

8. The memory of claim 4, wherein the first input output circuit further comprises:
a first sub-output circuit which is electrically connected to each of the second voltage node, a second data line, and a second complementary data line, and is configured to output an amplified comparison result; and
a second sub-output circuit which is electrically connected to each of the first voltage node, the second data line, and the second complementary data line, and is configured to output the amplified comparison result and match an output load of the first amplification circuit, wherein the second data line and the second complementary data line transmit mutually-inverted data.

9. The memory of claim 5, wherein the first input output circuit further comprises:
a first sub-output circuit which is electrically connected to each of the second voltage node, a second data line, and a second complementary data line, and is configured to output an amplified comparison result; and
a second sub-output circuit which is electrically connected to each of the first voltage node, the second data line, and the second complementary data line, and is configured to output the amplified comparison result and match an output load of the first amplification circuit, wherein the second data line and the second complementary data line transmit mutually-inverted data.

10. The memory of claim 6, wherein the first input output circuit further comprises:
a first sub-output circuit which is electrically connected to each of the second voltage node, a second data line, and a second complementary data line, and is configured to output an amplified comparison result; and
a second sub-output circuit which is electrically connected to each of the first voltage node, the second data line, and the second complementary data line, and is configured to output the amplified comparison result and match an output load of the first amplification circuit, wherein the second data line and the second complementary data line transmit mutually-inverted data.

11. The memory of claim 3, wherein the first output circuit further comprises:
a first switch circuit through which the first voltage node is electrically connected to an equalization signal; and
a second switch circuit through which the second voltage node is electrically connected to the equalization signal.

12. The memory of claim 4, wherein the first output circuit further comprises:
a first switch circuit through which the first voltage node is electrically connected to an equalization signal; and
a second switch circuit through which the second voltage node is electrically connected to the equalization signal.

13. The memory of claim 5, wherein the first output circuit further comprises:
a first switch circuit through which the first voltage node is electrically connected to an equalization signal; and
a second switch circuit through which the second voltage node is electrically connected to the equalization signal.

14. The memory of claim 11, wherein the first switch circuit comprises a ninth transistor, and the second switch circuit comprises a tenth transistor,
the ninth transistor is configured to enable a source to be electrically connected to the first voltage, a drain to be electrically connected to the first voltage node, and a gate to be electrically connected to the equalization signal; and
the tenth transistor is configured to enable a source to be electrically connected to the first voltage, a drain to be electrically connected to the second voltage node, and a gate to be electrically connected to the equalization signal.

15. The memory of claim 7, wherein the first sub-output circuit comprises:
an eleventh transistor configured to enable to a source to be electrically connected to the first voltage, and a gate to be electrically connected to the second voltage node;
a twelfth transistor configured to enable a drain to be electrically connected to the drain of the eleventh transistor, and a gate to be electrically connected to each of the second voltage node and the gate of the eleventh transistor;
a thirteenth transistor configured to enable a source to be grounded, a drain to be electrically connected to the source of the twelfth transistor, and a gate to be electrically connected to the second data line; and
a fourteenth transistor configured to enable a source to be electrically connected to the first voltage, a drain to be electrically connected to each of the second complementary data line and the drain of the eleventh transistor, and a gate to be electrically connected to the second data line.

16. The memory of claim 7, wherein the second sub-output circuit comprises:
a fifteenth transistor configured to enable a source to be electrically connected to the first voltage, a drain to be electrically connected to the second data line, and a gate to be electrically connected to the first voltage node;
a sixteenth transistor configured to enable a drain to be electrically connected to the drain of the fifteenth transistor, and a gate to be electrically connected to each of the first voltage node and the gate of the fifteenth transistor;
a seventeenth transistor configured to enable a drain to be electrically connected to a source of the sixteenth transistor, and a gate to be electrically connected to the second complementary data line;
an eighteenth transistor configured to enable a source to be grounded, a drain to be electrically connected to a source of the seventeenth transistor, and a gate to be electrically connected to a reset signal;
a nineteenth transistor configured to enable a source to be electrically connected to the first voltage, a drain to be electrically connected to the second data line, and a gate to be electrically connected to each of the second complementary data line and the gate of the seventeenth transistor; and
a twentieth transistor configured to enable a source to be electrically connected to the first voltage, a drain to be electrically connected to the second data line, and a gate to be electrically connected to each of the reset signal and the gate of the eighteenth transistor.

17. The memory of claim 7, wherein the first reading circuit unit further comprises:
a regulating circuit which is electrically connected to each of the first data line, a reading selection signal, the first amplification circuit and the first input circuit, and configured to regulate driving capacity of the first input circuit.

18. The memory of claim 17, wherein the regulating circuit comprises:
a twenty-first transistor configured to enable a source to be electrically connected to the second voltage, a drain to be electrically connected to the first voltage node, and a gate to be electrically connected to the reading selection signal; and
a twenty-second transistor configured to enable a source to be electrically connected to the second voltage, a drain to be electrically connected to the first voltage node, and a gate to be electrically connected to the first data line through a third switch circuit.

19. The memory of claim 17, wherein the first reading circuit unit further comprises a first writing circuit unit; the first writing circuit unit is electrically connected to the second data line, a write enable signal, an equalization signal and the first data line, and the first writing circuit unit is configured to write data into the first data line according to the write enable signal and the equalization signal.

20. The memory of claim 19, wherein the first writing circuit unit comprises:
- a twenty-third transistor configured to enable a source to be electrically connected to the first voltage, and a drain to be electrically connected to the first data line;
- a twenty-fourth transistor configured to enable a source to be grounded, and a drain to be electrically connected to each of the drain of the twenty-third transistor and the first data line;
- a first NOR gate configured to enable an output end to be electrically connected to a gate of the twenty-third transistor;
- a second NOR gate configured to enable an output end to be electrically connected to a gate of the twenty-fourth transistor;
- a first NAND gate configured to enable an output end to be electrically connected to a first input end of the second NOR gate, a first input end to be electrically connected to the write enable signal, and a second input end to be electrically connected to the equalization signal;
- a first AND gate configured to enable an output end to be electrically connected to a second input end of the first NOR gate, a first input end to be electrically connected to the write enable signal, and a second input end to be electrically connected to a second input end of the second NOR gate and the second data line; and
- a first inverter configured to enable an output end to be electrically connected to a first input end of the first NOR gate, and an input end to be electrically connected to the equalization signal.

\* \* \* \* \*